United States Patent
Duriez et al.

(10) Patent No.: US 9,443,729 B1
(45) Date of Patent: Sep. 13, 2016

(54) METHOD FOR FORMING FINFET DEVICES

(71) Applicant: Taiwan Semiconductor Manufacturing Company, Ltd., Hsin-Chu (TW)

(72) Inventors: Blandine Duriez, Brussels (BE); Martin Christopher Holland, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/674,589

(22) Filed: Mar. 31, 2015

(51) Int. Cl.
| | |
|---|---|
| *H01L 21/02* | (2006.01) |
| *H01L 21/76* | (2006.01) |
| *H01L 21/761* | (2006.01) |
| *H01L 21/762* | (2006.01) |
| *H01L 29/66* | (2006.01) |
| *H01L 29/68* | (2006.01) |
| *H01L 29/02* | (2006.01) |
| *H01L 29/06* | (2006.01) |
| *H01L 29/78* | (2006.01) |

(52) U.S. Cl.
CPC ... *H01L 21/02664* (2013.01); *H01L 21/02587* (2013.01); *H01L 21/02658* (2013.01); *H01L 21/76224* (2013.01); *H01L 29/0653* (2013.01); *H01L 29/0657* (2013.01); *H01L 29/66795* (2013.01); *H01L 29/785* (2013.01)

(58) Field of Classification Search
CPC .................. H01L 21/02664; H01L 21/02587; H01L 21/02658; H01L 29/0653
See application file for complete search history.

(56) References Cited

U.S. PATENT DOCUMENTS

| | | | |
|---|---|---|---|
| 7,425,740 B2 | 9/2008 | Liu et al. | |
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2011/0049568 A1 | 3/2011 | Lochtefeld et al. | |
| 2013/0285153 A1 | 10/2013 | Lee et al. | |
| 2014/0183600 A1 | 7/2014 | Huang et al. | |
| 2014/0239347 A1 | 8/2014 | van Dal | |
| 2014/0264590 A1 | 9/2014 | Yu et al. | |
| 2014/0264592 A1 | 9/2014 | Oxland et al. | |

FOREIGN PATENT DOCUMENTS

TW 201434156 A 9/2014

OTHER PUBLICATIONS

Vellianitis, G., et al., "High crystalline quality Ge grown by MOCVD inside narrow shallow trench isolation defined on Si(001) substrates," Journal of Crystal Growth, Aug. 15, 2013, 3 pages.

*Primary Examiner* — Su C Kim
*Assistant Examiner* — David S Wilbert
(74) *Attorney, Agent, or Firm* — Slater Matsil, LLP (57) ABSTRACT

A method comprises providing a substrate formed of a first semiconductor material, wherein the substrate comprises a plurality of isolation regions, etching away upper portions of the substrate to form a plurality of trenches, wherein each trench is between two adjacent isolation regions, overgrowing a plurality of semiconductor fins in the trenches over the substrate through an epitaxial growth process, wherein upper portions of the semiconductor fins are above top surfaces of the isolation regions, applying a planarization process to the semiconductor fins, wherein top surfaces of the semiconductor fins are level with top surfaces of the isolation regions as a result of performing the step of applying the planarization process and removing a defect semiconductor fin to form a vacant trench.

20 Claims, 10 Drawing Sheets

METHOD FOR FORMING FINFET DEVICES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

Fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross sectional view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

As technologies further evolve, semiconductor process nodes have been scaled down for high density integrated circuits. As a result, the form factor of integrated circuit has been improved from shrinking the semiconductor process node (e.g., shrink the process node towards the sub-20 nm node). As semiconductor devices are scaled down, new techniques are needed to maintain the electronic components' performance from one generation to the next. For example, transistors formed by high carrier mobility materials such as III-V materials, germanium and/or the like are desirable for high density and high speed integrated circuits.

Germanium and silicon are group IV elements in the periodic table. In comparison with silicon, germanium is of higher carrier and hole mobility. The higher carrier and hole mobility of germanium may lead to better device electrical properties. For example, the lattice electron mobility of silicon is 1417 $cm^2/V$-sec. In contrast, the lattice electron mobility of germanium is 3900 $cm^2/V$-sec. The electron mobility of germanium is about 2.75 times more than that of silicon. Such higher electron mobility of germanium leads to higher drive current and smaller gate delay. It should be noted that some group III-V materials may be used to replace silicon because some of group III_V materials may have much higher mobility than germanium and silicon.

Germanium is of various advantages in comparison with silicon. However, silicon wafers are dominant in the semiconductor industry because the cost of germanium wafers is very high. One widely accepted solution of fabricating germanium based transistor is growing germanium active regions on silicon substrates through an epitaxial growth process. Growing a germanium layer on a silicon substrate is commonly referred to as germanium-silicon hetero-epitaxial growth. The lattice constant of germanium is about 4.2% more than the lattice constant of silicon. When a germanium layer is grown on a silicon substrate, the germanium layer is compressively strained to fit the lattice spacing of the silicon substrate. After the germanium layer is grown more than a critical thickness, the strain may be relieved by forming a variety of threading dislocations. Such threading dislocations are defects, which may degrade electrical properties of germanium based transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
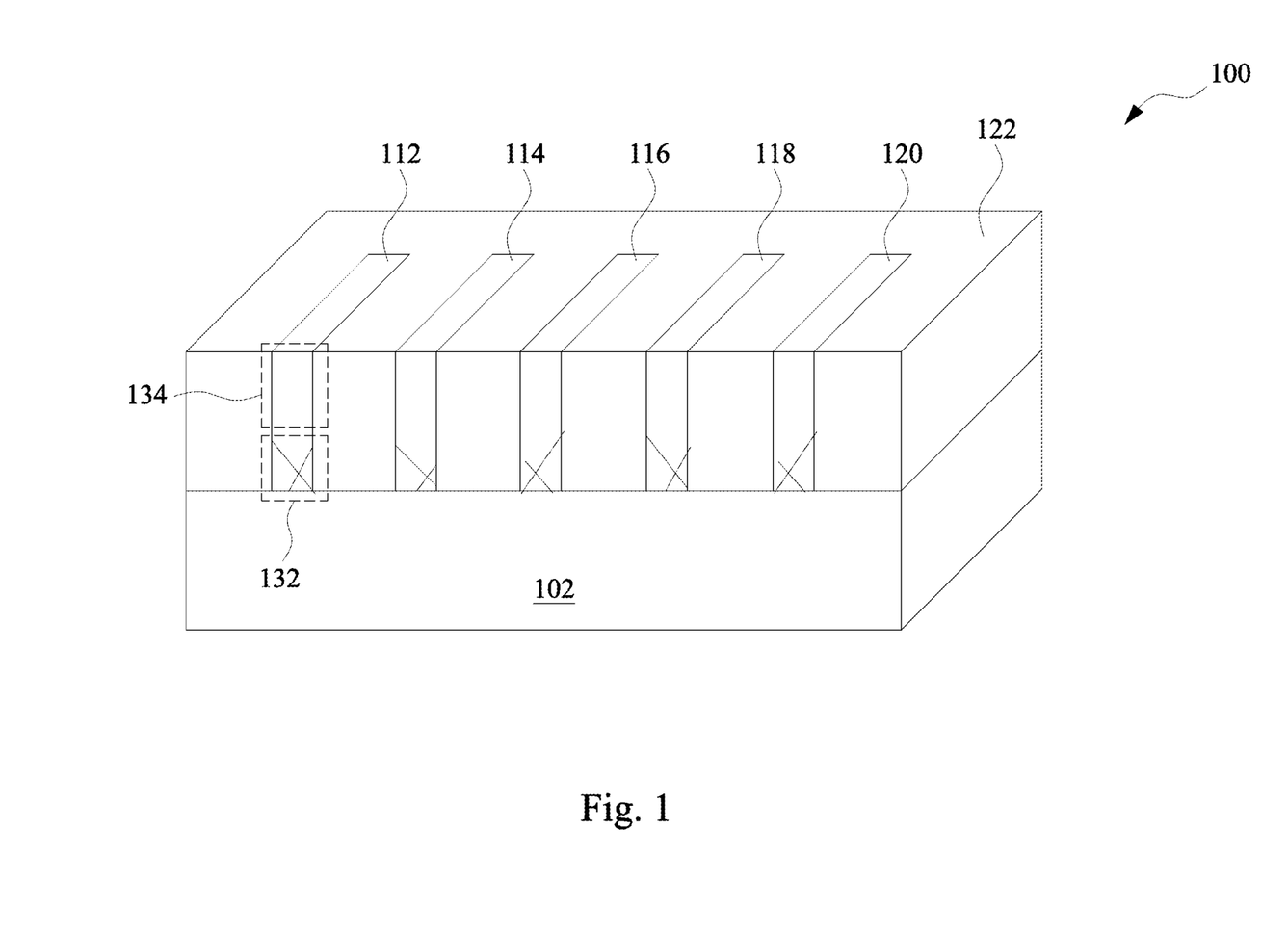
FIG. 1 illustrates a perspective view of a FinFET device in accordance with various embodiments of the present disclosure.

FIG. 1 illustrates a perspective view of a FinFET device in accordance with various embodiments of the present disclosure. The FinFET device 100 includes a substrate 102, an isolation region 122 and a plurality of fins formed over the substrate 102. As shown in FIG. 1, there may be five fins, namely a first fin 112, a second fin 114, a third fin 116, a fourth fin 118 and a fifth fin 120. It should be noted that while FIG. 1 illustrates the FinFET device 100 with five fins, the FinFET device 100 could accommodate any number of fins. The number of fins illustrated herein is limited solely for the purpose of clearly illustrating the inventive aspects of the various embodiments.

In some embodiments, the substrate 102 may be a crystalline structure. The substrate 102 may be formed of silicon, although it may also be formed of other group III, group IV, and/or group V elements, such as silicon, germanium, gallium, arsenic, and combinations thereof. In some embodiments, the substrate 102 comprises a first semiconductor material having a first crystal orientation. The first semiconductor material is silicon and the first crystal orientation is a <001> crystal orientation.

In some embodiments, the fins may be formed of a second semiconductor material different from the first semiconductor material of the substrate 102. The second semiconductor material may be selected from the group consisting of group IV elements, group III-V compounds, group II-VI compounds. Furthermore, the fins may be not formed of a single semiconductor material. Instead, the fins may be formed by a plurality of semiconductor layers stacked together and each of the stacked semiconductor layers may be formed of different semiconductor materials such as group IV elements, group III-V compounds, group II-VI compounds.

According to an embodiment, the second semiconductor material is germanium. In addition, the upper portions of the fins may be of a second crystal orientation. According to an embodiment, the second crystal orientation is a <111> crystal orientation.

Each fin (e.g., fin 112) may be divided into two portions. A lower portion of each fin is used to trap dislocation defects and an upper portion of each fin functions as a channel region of a FinFET device (not shown). As shown in FIG. 1, all fins have similar structures. For simplicity, only the structure of fin 112 is described in detail below.

A lower portion 132 of the fin 112 is surrounded by the isolation regions 122. As indicated by the dashed box, the dislocation defects are confined in the lower portion 132. The dislocation defects confined in the lower portion 132 may comprise threading dislocation defects, stacking faults and/or the like. As shown in FIG. 1, the various dislocation defects reach the sidewalls of the trench of the fin 112 and terminate at the sidewalls. In other words, in a trench having a depth much greater than the width of the trench, the upper portion of the trench may be free from the dislocation defects.

An upper portion 134 of the fin 112 is over the lower portion 132. The upper portion 134 is a defect-free region. In order to form a FinFET transistor, the upper portions of the isolation regions may be etched away. After the upper portions of the isolation regions have been removed, the upper portion 134 is exposed. The exposed upper portion 134 may function as a channel region of the FinFET transistor (not shown).

The FinFET device 100 may comprise the isolation regions 122. The isolation regions 122 may be implemented by a shallow trench isolation (STI) structure. The STI structure may be fabricated by using suitable techniques including photolithography and etching processes. In particular, the photolithography and etching processes may comprise depositing a commonly used mask material such as photoresist over the substrate 102, exposing the mask material to a pattern, etching the substrate 102 in accordance with the pattern. In this manner, a plurality of openings may be formed as a result. The openings are then filled with dielectric materials to form the STI structures (e.g., isolation regions 122). In accordance with an embodiment, the isolation regions may be filled with a dielectric material such as an oxide material, a high-density plasma (HDP) oxide or the like. A chemical mechanical polishing (CMP) process is then performed to remove excess portions of the dielectric materials, and the remaining portions are the isolation regions 122.

Figure 2:
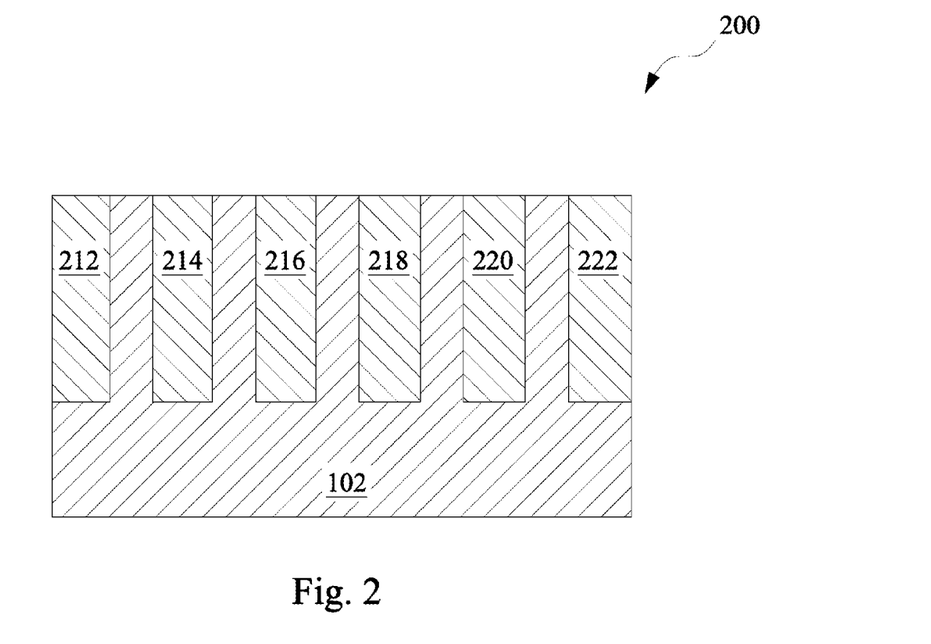
FIG. 2 illustrates a semiconductor device having a plurality of isolation regions in a substrate in accordance with various embodiments of the present disclosure.

FIGS. 2-8 illustrate intermediate steps of fabricating the FinFET device shown in FIG. 1 in accordance with various embodiments of the present disclosure. FIG. 2 illustrates a semiconductor device having a plurality of isolation regions in a substrate in accordance with various embodiments of the present disclosure. The semiconductor device 200 includes a substrate 102 and a plurality of isolation regions formed in the substrate 102. The substrate 102 may also be formed of other group III, group IV, and/or group V elements, such as silicon, germanium, gallium, arsenic, and combinations thereof.

In some embodiments, the substrate 102 is formed of silicon. The upper portions of the substrate 102 are separated by isolation regions as shown in FIG. 2. The isolation regions 212, 214, 216, 218, 220 and 222 are formed of a dielectric material such as an oxide material, a high-density plasma (HDP) oxide or the like. The formation process of the isolation regions shown in FIG. 2 is similar to the formation process of the isolation region described above with respect to FIG. 1, and hence is not discussed herein to avoid repetition. It should be noted that while FIG. 2 shows the isolation regions 212-222 may be separate isolation regions and two adjacent isolation regions are facing each other, the isolation regions 212-222 may be portions of a continuous region as shown in FIG. 1.

Figure 3:
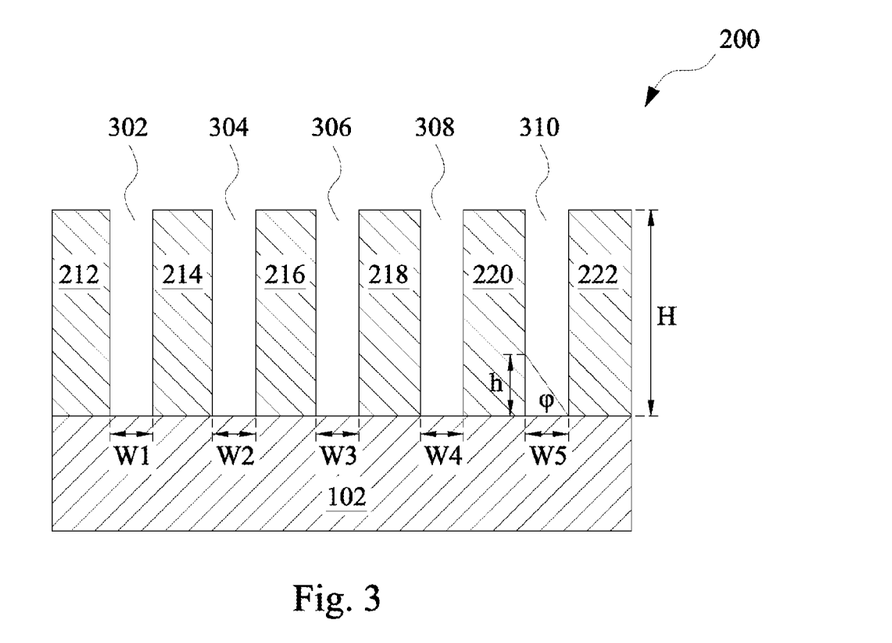
FIG. 3 illustrates a cross sectional view of the semiconductor device shown in FIG. 2 after the upper portions of the substrate have been removed in accordance with various embodiments of the present disclosure.

FIG. 3 illustrates a cross sectional view of the semiconductor device shown in FIG. 2 after the upper portions of the substrate have been removed in accordance with various embodiments of the present disclosure. The upper portions of the substrate 102 may be removed by a suitable silicon removal process such as an etching process. The etching process is applied to the upper portions of the substrate 102 until the corners of the isolation regions are exposed. As a result, trenches 302, 304, 306, 308 and 310 have been formed between the respective isolation regions. More particularly, the trench 302 has a width W1 and is between the isolation regions 212 and 214; the trench 304 has a width W2 and is between the isolation regions 214 and 216; the trench 306 has a width W3 and is between the isolation regions 216 and 218; the trench 308 has a width W4 and is between the isolation regions 218 and 220; the trench 310 has a width W5 and is between the isolation regions 220 and 222. In some embodiments, all trenches shown in FIG. 3 have equal widths. In alternative embodiments, the widths of trenches 302, 304, 306, 308 and 310 are substantially equal to each other.

As shown in FIG. 3, all trenches have similar structures and shapes. For simplicity, only the structure of the trench 310 is described in detail below. The height of the trench 310 is defined as H. The width of the trench 310 is defined as W. The semiconductor fins shown in FIG. 1 are grown from the substrate using an epitaxial growth process. The epitaxial growth process may be grown from the surface of the substrate 102 toward the sidewall of the trench 310 at an angle φ. In some embodiments, φ is equal to 60 degrees.

The dislocation defects shown in FIG. 1 reach the sidewall of the trench 310 and terminate at the sidewall of the trench 310. In other words, the region beyond the height h shown in FIG. 3 is a defect-free region. The detailed dislocation trapping process will be discussed below with respect to FIG. 4.

The relationship between h and W can be expressed by the following equation:

$$h = W \cdot \tan(\phi) \quad (1)$$

According to Equation (1) above, h is equal to 1.73 times W when φ is equal to 60 degrees. In some embodiments, the width of the trench 310 is equal to 25 nm. The corresponding dislocation confining height h is equal to 43 nm. In alternative embodiments, the width of the trench 310 is equal to 20 nm. The corresponding dislocation confining height h is equal to 34 nm. In order to fabricate a defect-free channel region, the height of the trench 310 should be greater the dislocation confining height h. In consideration with process variations and design for manufacturing, the height of the trench H is equal to two times h. In other words, when the width of trench 310 is about 25 nm, the height of the trench 310 should be around 86 nm. Likewise, when the width of trench 310 is about 20 nm, the height of the trench 310 should be around 68 nm.

Figure 4:
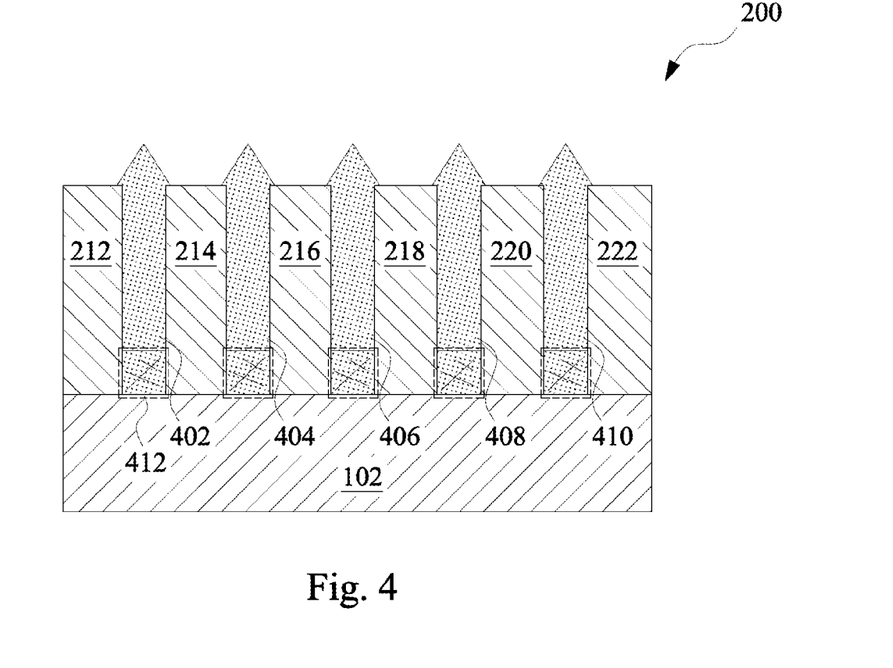
FIG. 4 illustrates a cross sectional view of the semiconductor device shown in FIG. 3 after a plurality of semiconductor regions are grown in the trenches in accordance with various embodiments of the present disclosure.

FIG. 4 illustrates a cross sectional view of the semiconductor device shown in FIG. 3 after a plurality of semiconductor regions are grown in the trenches in accordance with various embodiments of the present disclosure. Semiconductor regions 402, 404, 406, 408 and 410 comprise a different semiconductor material from the substrate 102. In accordance with some embodiments, the semiconductor regions 402, 404, 406, 408 and 410 comprise germanium, which has a lattice constant different from that of the substrate 102, which may be formed of silicon. The semiconductor regions 402, 404, 406, 408 and 410 may be formed by a selective epitaxial growth (SEG) process.

In accordance with another embodiment, the semiconductor regions 402, 404, 406, 408 and 410 may comprise silicon germanium, which may be expressed as $Si_{1-x}Ge_x$, wherein x is the atomic percentage of germanium in silicon germanium, and may be greater than 0 and equal to or less than 1. When x is equal to 1, the semiconductor regions 402, 404, 406, 408 and 410 may be formed of pure germanium. In accordance with another embodiment, the semiconductor regions 402, 404, 406, 408 and 410 may comprise a compound semiconductor material comprising group III and group V elements, or a compound material comprising group II and group VI elements.

The lattice constant of germanium is greater than the lattice constant of silicon. There may be a 4.2% lattice mismatch between germanium and silicon. As a result, a plurality of threading dislocations may be generated during the SEG process. However, the threading dislocations may be trapped inside the trench. More particularly, the threading dislocations are trapped in a lower portion (e.g., a lower portion 412 of the semiconductor region 402). When the semiconductor regions 402, 404, 406, 408 and 410 are grown increasingly higher, more and more threading dislocations are blocked by sidewalls of the trenches. As a result, the upper portions (e.g., the upper portion of the semiconductor region 402) are free of threading dislocations.

The growth process of the semiconductor regions 402, 404, 406, 408 and 410 is over-grown. As a result, the triangular upper portions of the semiconductor regions 402, 404, 406, 408 and 410 are formed over the top surfaces of the isolation regions.

Figure 5:
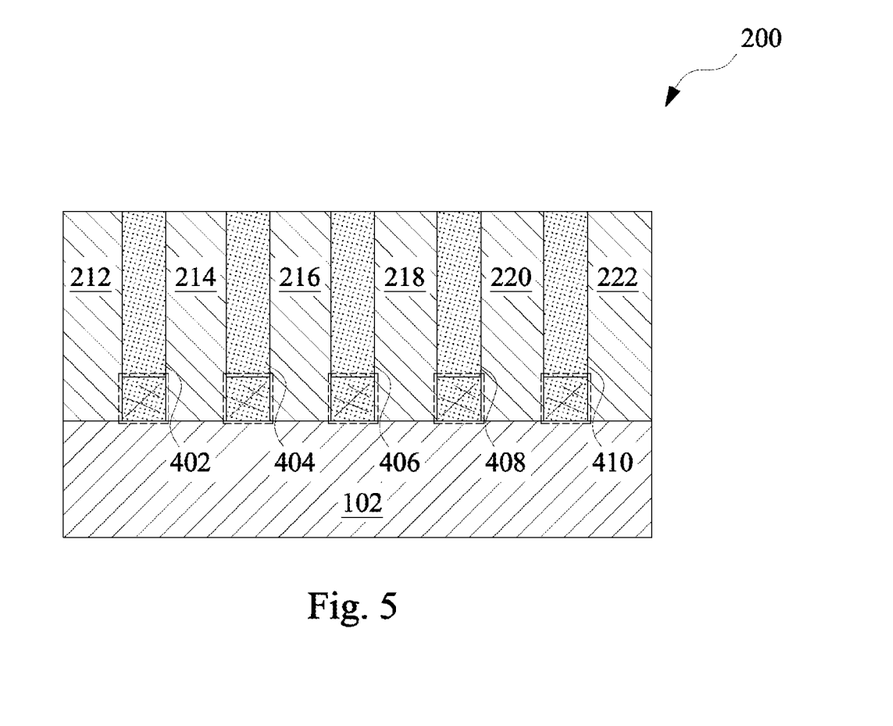
FIG. 5 illustrates the semiconductor device shown in FIG. 4 after the overgrown portions have been removed in accordance with various embodiments of the present disclosure.

FIG. 5 illustrates the semiconductor device shown in FIG. 4 after the overgrown portions have been removed in accordance with various embodiments of the present disclosure. A planarization process is performed to remove the upper portions of the semiconductor regions 402, 404, 406, 408 and 410 so that the top surface of the semiconductor regions 402, 404, 406, 408 and 410 are level with the top surfaces of the isolation regions.

In some embodiments, the planarization process is a chemical mechanical polish (CMP) process. In the CMP process, a combination of etching materials and abrading materials are put into contact with the top surface of the semiconductor device and a grinding pad (not shown) is used to grind away the overgrown portions of the semiconductor regions 402, 404, 406, 408 and 410 until the top surfaces of the remaining semiconductor regions 402, 404, 406, 408 and 410 are level with the top surfaces of the isolation regions. Since semiconductor regions 402, 404, 406, 408 and 410 are fin regions of a FinFET device, regions 402-410 are alternatively referred to as fins 402-410 throughout the description.

Figure 6:
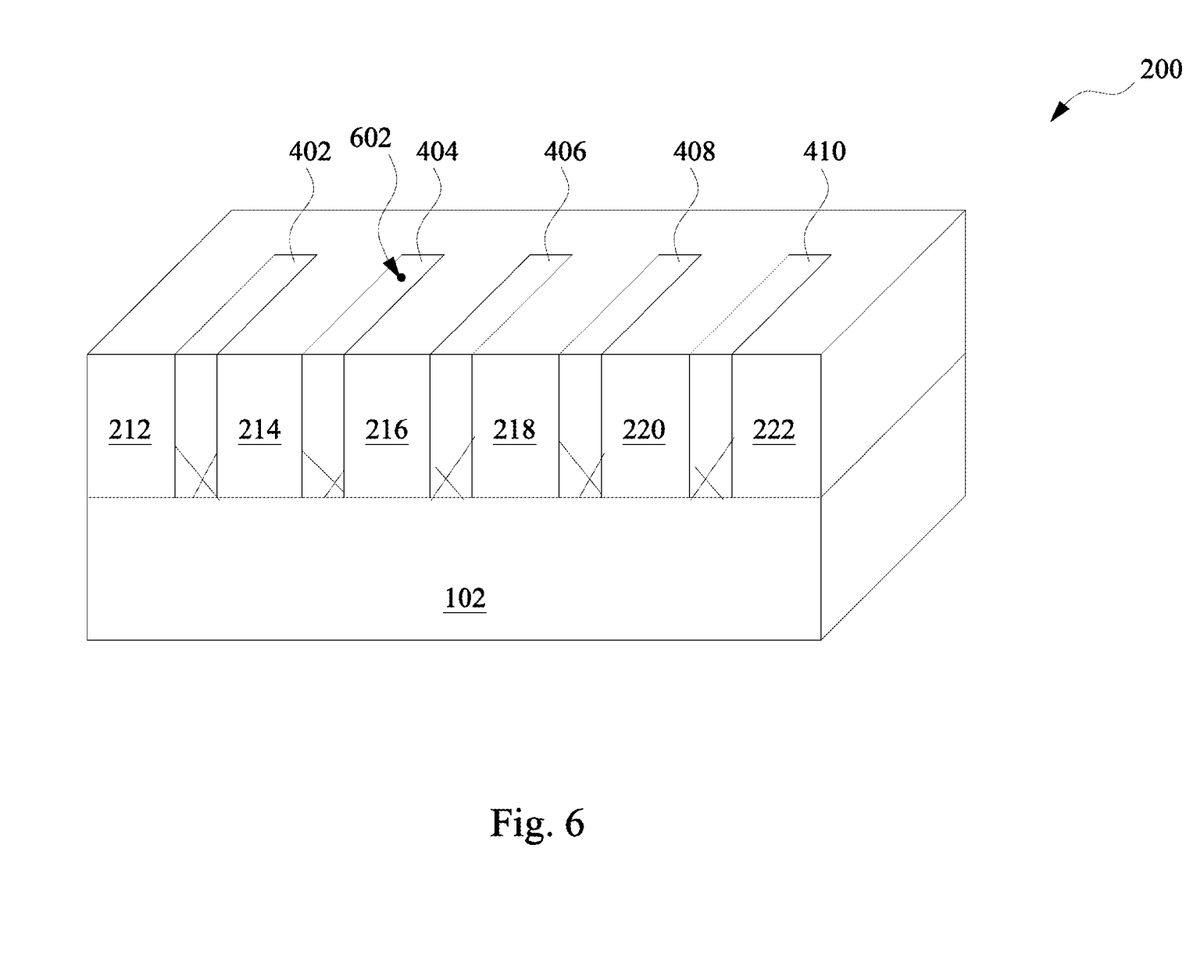
FIG. 6 illustrates a perspective view of the FinFET device shown in FIG. 5 in accordance with various embodiments of the present disclosure.

FIG. 6 illustrates a perspective view of the FinFET device shown in FIG. 5 in accordance with various embodiments of the present disclosure. After the CMP process has been applied to the fins 402, 404, 406, 408 and 410, the top surfaces of the fins are level with the top surfaces of the isolation regions (e.g., isolation region 212). The dislocation defects are confined in the trenches. However, some dislocation defects may propagate along the sidewalls of the trenches and reach the top surfaces of the fins. As shown in FIG. 6, there may be at least one dislocation defect 602 on the top surface of the fin 404.

Figure 7:
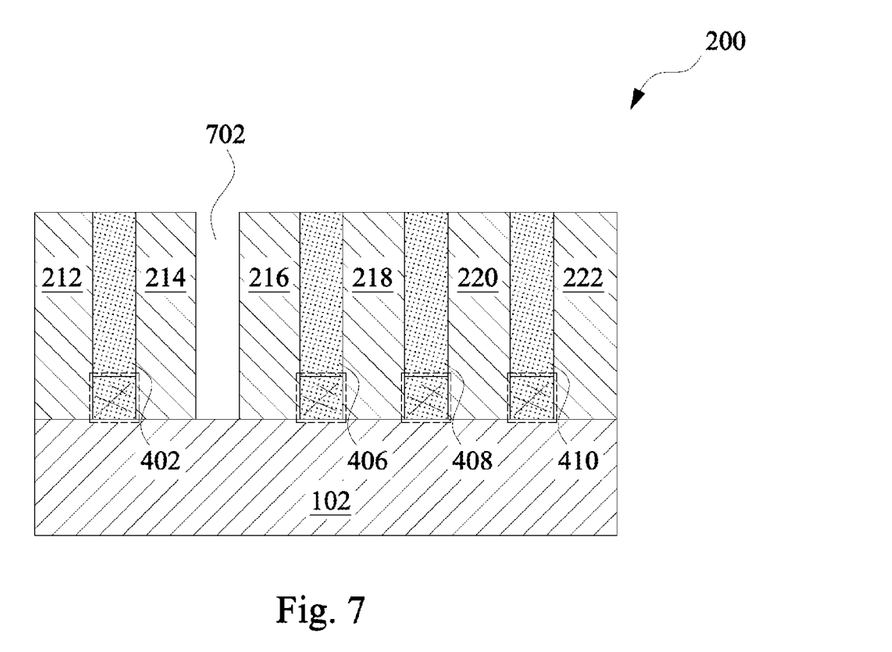
FIG. 7 illustrates a cross sectional view of the semiconductor device shown in FIG. 5 after an etching process has been applied to the semiconductor device in accordance with various embodiments of the present disclosure.

FIG. 7 illustrates a cross sectional view of the semiconductor device shown in FIG. 5 after an etching process has been applied to the semiconductor device in accordance with various embodiments of the present disclosure. A selective etching process may be applied to the semiconductor device 200. During the etching process, the fins with dislocation defects on the top surfaces (e.g., fin 404) are etched at a much higher rate than the fins without dislocation defects on the top surfaces (e.g., fins 402, 406, 408 and 410).

In some embodiments, the fin 404 is formed of germanium. The fin 404 may be removed in a chamber using a dry etching process. When the dry etching process is applied to the semiconductor device 200, the temperature of the chamber is about 500 degrees. The pressure of the chamber is about 40 Torr. The gases of the dry etching include hydrogen chloride (HCl) and H2. The flow rate of HCl is about 200 sccm. The flow rate of H2 is about 30 sccm. The reaction time is about 10 minutes. It should be noted the etching process is applied to the semiconductor device 200 until the top surface of the substrate 102 is exposed as shown in FIG. 7. After the fin 404 has been removed, a vacant trench 702 is formed in the semiconductor device 200 as shown in FIG. 7.

Alternatively, the defective fin 404 may be removed by another selective etching solution comprising HBr and H2O. The ratio of HBr to H2O is 2.11:1. The etching process is performed at room temperature for about five minutes.

After the etching process finishes, vacant trenches (e.g., vacant trench 702) can be found by automatic defect detection tools. In some embodiments, the vacant trenches may be detected by a SEMVision tool.

Figure 8:
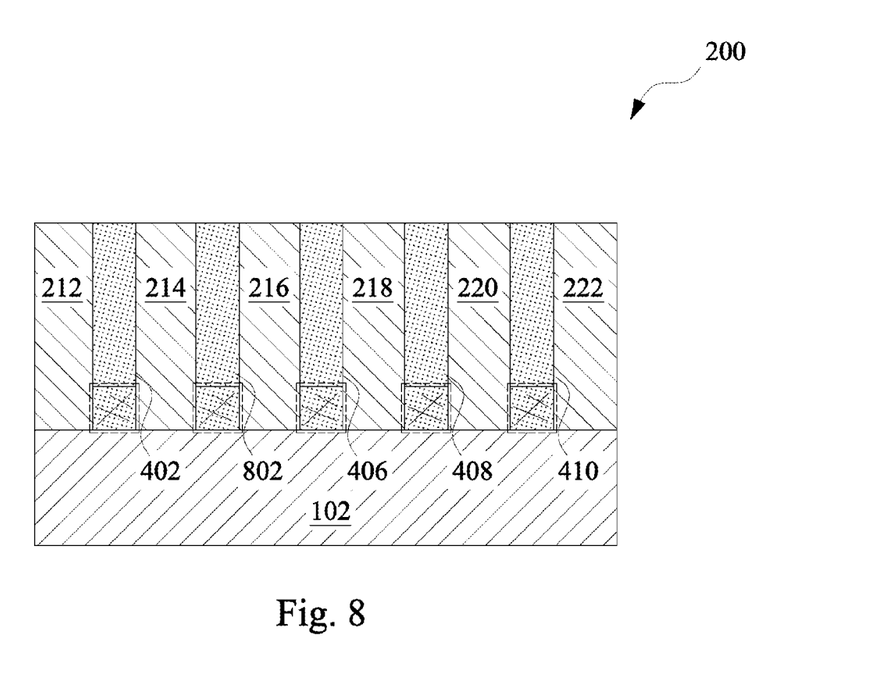
FIG. 8 illustrates a cross sectional view of the semiconductor device shown in FIG. 7 after an epitaxial growth is applied to the semiconductor device and a CMP process is applied subsequently in accordance with various embodiments of the present disclosure.

FIG. 8 illustrates a cross sectional view of the semiconductor device shown in FIG. 7 after an epitaxial growth is applied to the semiconductor device and a CMP process is applied subsequently in accordance with various embodiments of the present disclosure. The epitaxial growth process and the CMP process for forming fin 802 are similar to those shown in FIGS. 4-5, and hence are not discussed in further detail to avoid unnecessary repetition.

Figure 9:
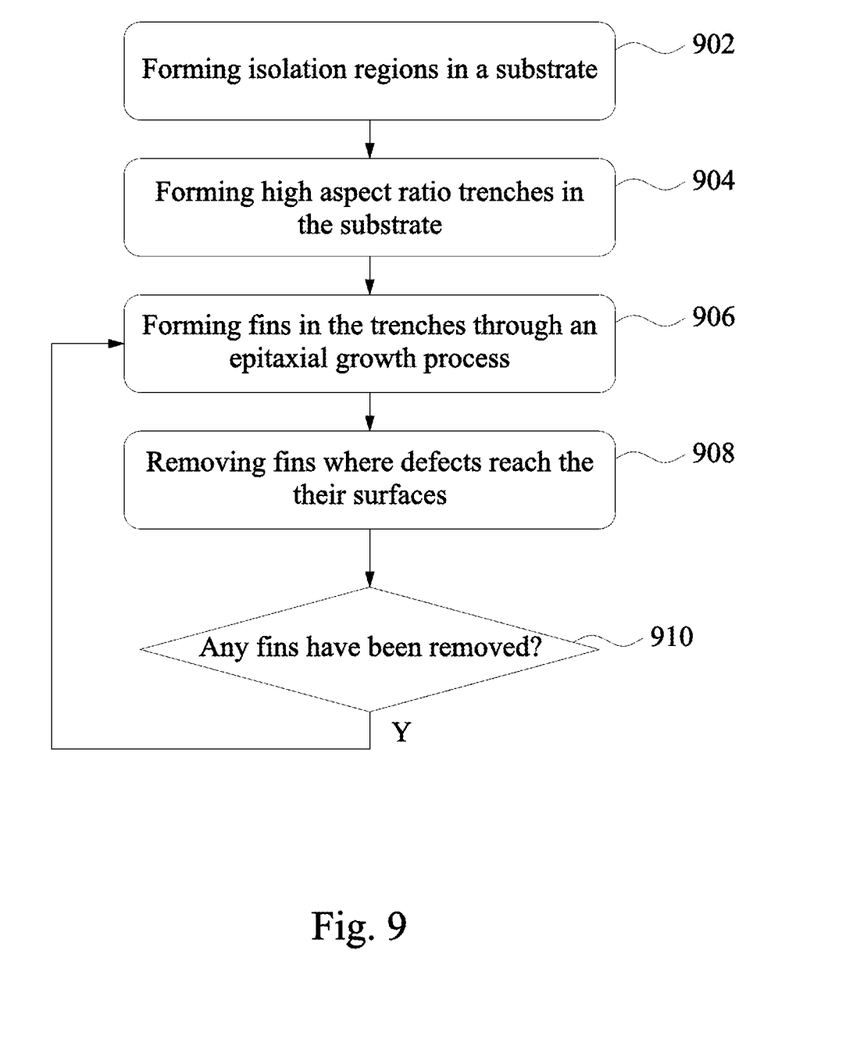
FIG. 9 illustrates a flow chart of fabricating a defect-free FinFET device in accordance with various embodiments of the present disclosure.

FIG. 9 illustrates a flow chart of fabricating a defect-free FinFET device shown in FIG. 8 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 9 may added, removed, replaced, rearranged and repeated.

At step 902, a plurality of isolation regions are formed in a substrate. At step 904, a plurality of high aspect ratio trenches are formed between isolation regions by removing the upper portions of the substrate through a suitable etching process. At step 906, a plurality of semiconductor fins are formed over a substrate using an epitaxial growth process. During the epitaxial growth process, dislocation defects may be confined in the lower portions of the trenches using an aspect-ratio-trapping technique. The semiconductor fins are overgrown and the upper portions of the semiconductor fins are over the top surfaces of the isolation regions. A CMP process is applied to the semiconductor fins. As a result of the CMP process, the top surfaces of the semiconductor fins are level with the top surfaces of the isolation regions.

At step 908, a selective etching process is employed to remove the semiconductor fins having the dislocation defects and form vacant trenches. After the etching process finishes, a defect detection tool is used to inspect the top surfaces of the semiconductor fins and find the vacant trenches.

At step 910, if any semiconductor fins have been removed, then step 906 is executed wherein new semiconductor fins are formed in the vacant trenches. On the other hand, if there are no vacant trenches, the fabricating process of a defect-free FinFET device finishes.

It should be noted that the flow chart shown in FIG. 9 is an iterative process. The steps shown in FIG. 9 may be repeated many times until no vacant trenches are observed on the top surface of the semiconductor device. Since the probability of having dislocation defects on the top surface of a semiconductor device is low, a defect-free FinFET device may be obtained after one iteration of the process shown in FIG. 9.

Figure 10:
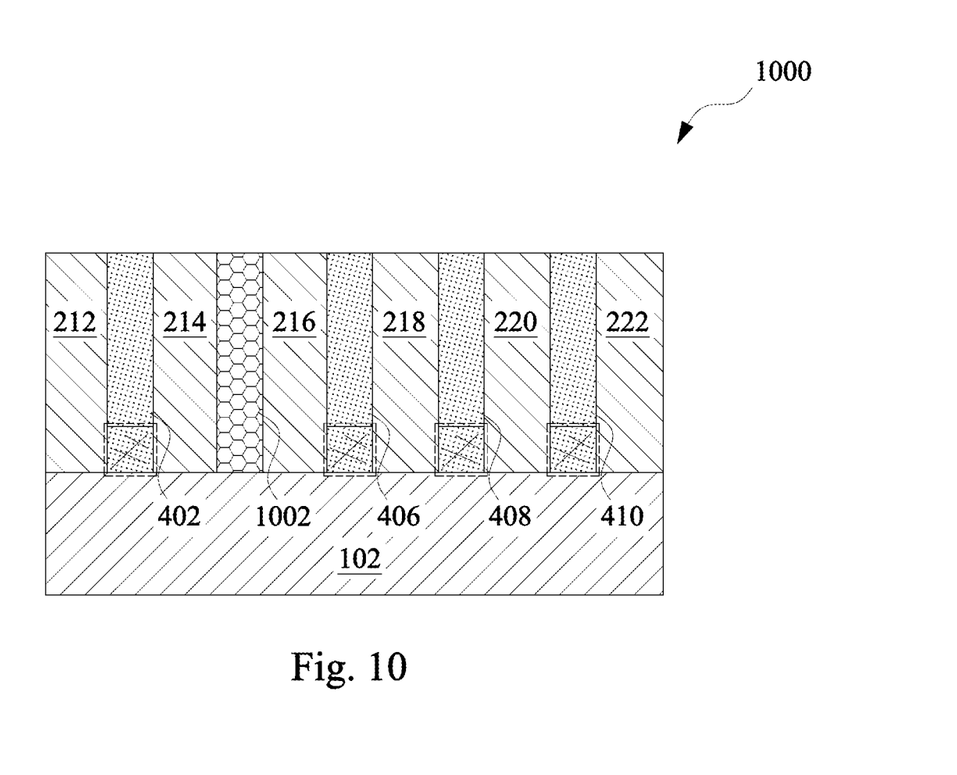
FIG. 10 illustrates a cross sectional view of the semiconductor device shown in FIG. 7 after a dielectric material is filled in the vacant trenches in accordance with various embodiments of the present application.

FIG. 10 illustrates a cross sectional view of the semiconductor device shown in FIG. 7 after a dielectric material is filled in the vacant trenches in accordance with various embodiments of the present application. After the semiconductor fin 404 has been removed the semiconductor device 1000, a dielectric material may be filled in the vacant trench to form isolation region 1002 as shown in FIG. 10. The isolation region 1002 may be formed with suitable deposition techniques such as CVD and the like. The dielectric material of the isolation region 1002 may be different from the dielectric material of the isolation regions 212-222. For example, the isolation regions 212-214 are formed of oxide. The isolation region 1002 may be filled with nitride. As a result, two adjacent semiconductor fins are separated by two different types of isolation regions. More particularly, the semiconductor fins 402 and 406 are separated by isolation regions 214, 1002 and 216, wherein isolation regions 214 and 216 are formed of oxide and isolation region 1002 is formed of nitride. In contrast, the semiconductor fins 406 and 408 are separated by the isolation region 218 formed of oxide.

Figure 11:
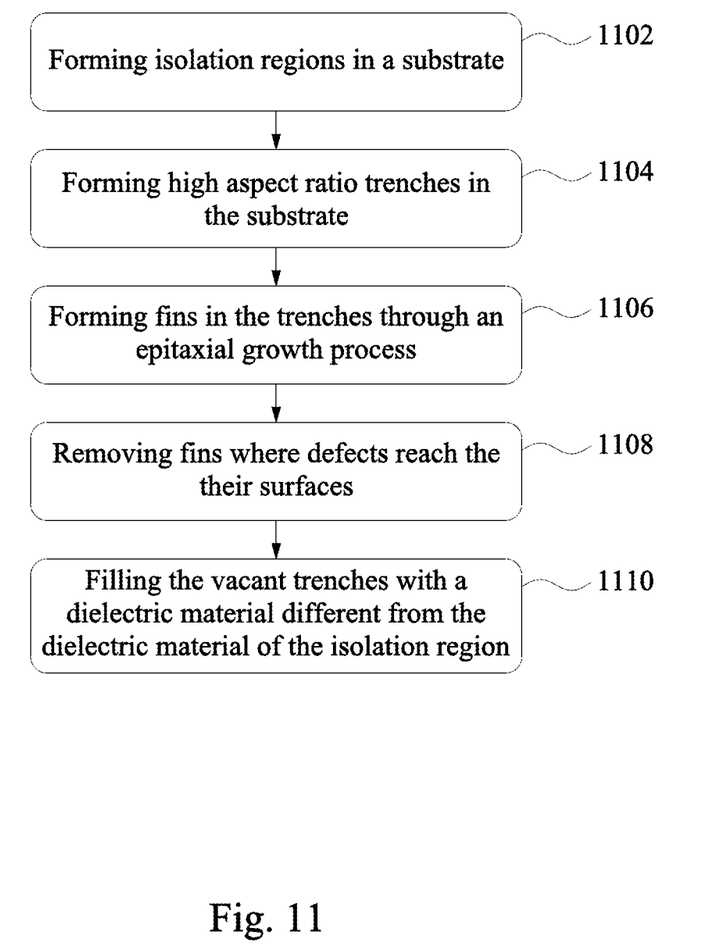
FIG. 11 illustrates a flow chart of fabricating the defect-free FinFET device shown in FIG. 10 in accordance with various embodiments of the present disclosure.

FIG. 11 illustrates a flow chart of fabricating the defect-free FinFET device shown in FIG. 10 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 11 may added, removed, replaced, rearranged and repeated.

Steps 1102, 1104, 1106 and 1108 are similar to steps 902, 904, 906 and 908 shown in FIG. 9, and hence are not discussed again to avoid repetition. At step 1110, if any semiconductor fins have been removed, a dielectric material such as nitride is deposited in the vacant trenches to form isolation regions. On the other hand, if there are no vacant trenches, the fabricating process of a defect-free FinFET device finishes.

Figure 12:
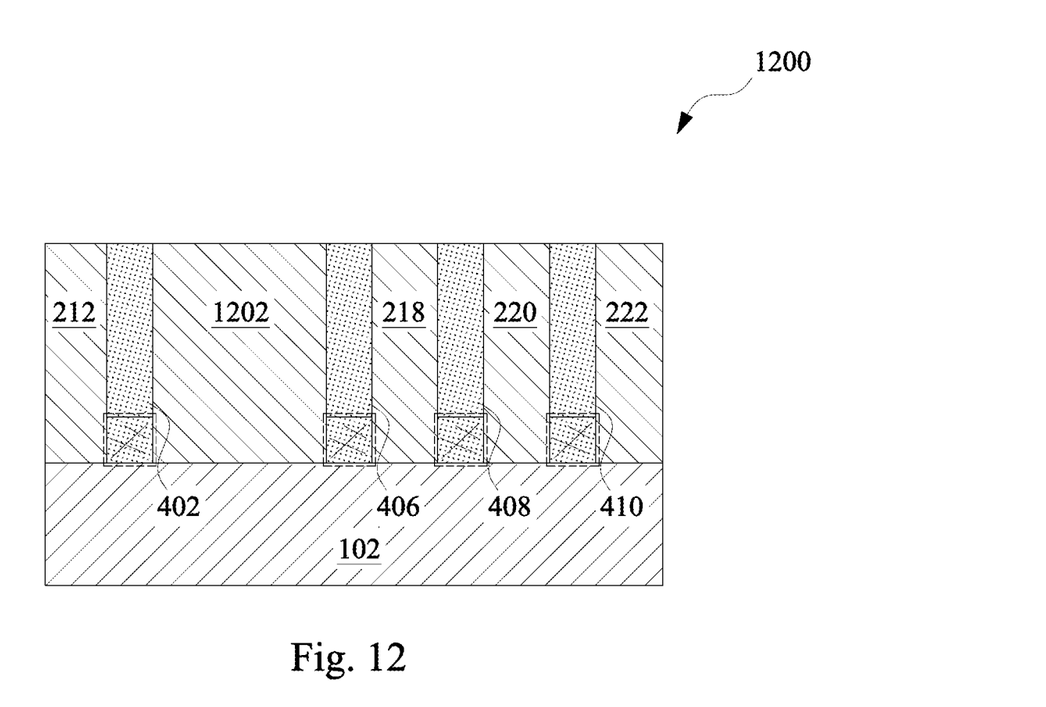
FIG. 12 illustrates a cross sectional view of the semiconductor device shown in FIG. 7 after a dielectric material is filled in the vacant trenches in accordance with various embodiments of the present application.

FIG. 12 illustrates a cross sectional view of the semiconductor device shown in FIG. 7 after a dielectric material is filled in the vacant trenches in accordance with various embodiments of the present application. After the semiconductor fin 404 has been removed, a dielectric material may be filled in the vacant trench. In some embodiment, the dielectric material filled in the vacant trench is the same as the dielectric material of the isolation regions 214 and 216. As a result, the isolation regions 214 and 216 are merged into a single isolation region 1202 as shown in FIG. 12. As a result of the merge of the isolation regions (e.g., isolation regions 214 and 216), the semiconductor device 1200 may have an irregular pitch layout. In other words, the distance between two adjacent semiconductor fins (e.g., fins 402 and 406) may be greater than the average distance of other semiconductor fins (e.g., fins 408 and 410).

Figure 13:
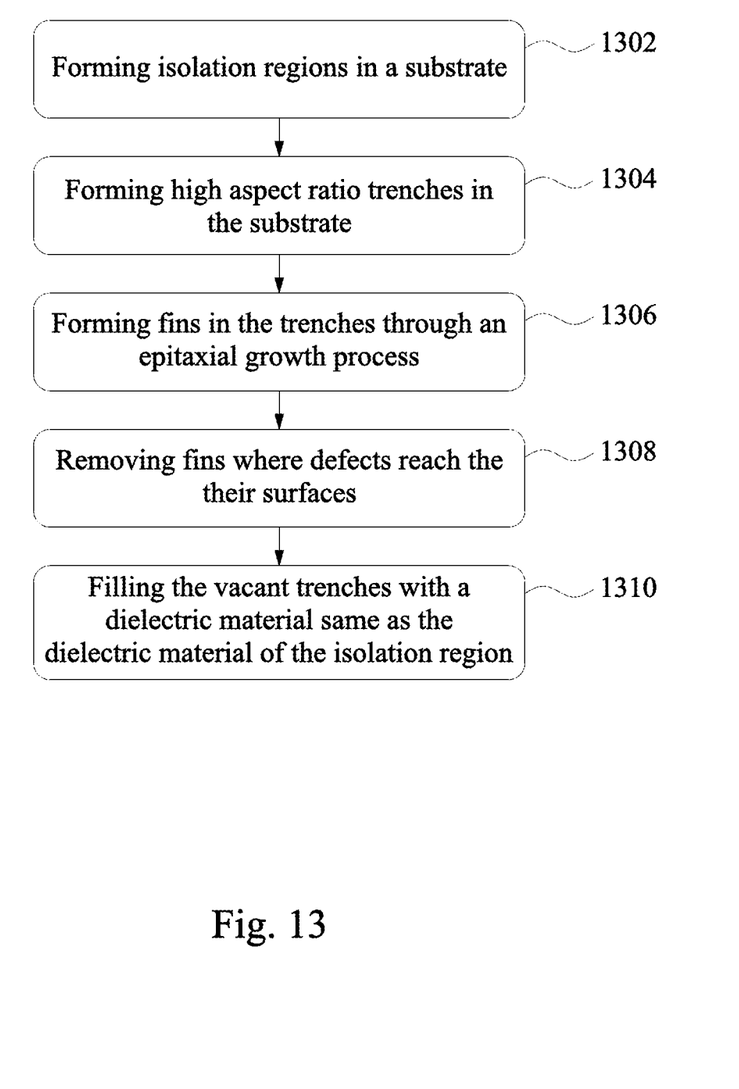
FIG. 13 illustrates a flow chart of fabricating the defect-free FinFET device shown in FIG. 12 in accordance with various embodiments of the present disclosure.

FIG. 13 illustrates a flow chart of fabricating the defect-free FinFET device shown in FIG. 12 in accordance with various embodiments of the present disclosure. This flowchart is merely an example, which should not unduly limit the scope of the claims. One of ordinary skill in the art would recognize many variations, alternatives, and modifications.

For example, various step as illustrated in FIG. 13 may added, removed, replaced, rearranged and repeated.

Steps 1302, 1304, 1306 and 1308 are similar to steps 902, 904, 906 and 908 shown in FIG. 9, and hence are not discussed again to avoid repetition. At step 1310, if any semiconductor fins have been removed, a dielectric material is deposited in the vacant trenches. The dielectric material filled in the vacant trenches is the same as the dielectric material of the isolation regions. On the other hand, if there are no vacant trenches, the fabricating process of the defect-free FinFET device finishes.

In accordance with an embodiment, a method providing a substrate formed of a first semiconductor material, wherein the substrate comprises a plurality of isolation regions, etching away upper portions of the substrate to form a plurality of trenches, wherein each trench is between two adjacent isolation regions, over-growing a plurality of semiconductor fins in the trenches over the substrate through an epitaxial growth process, wherein upper portions of the semiconductor fins are above top surfaces of the isolation regions, applying a planarization process to the semiconductor fins, wherein top surfaces of the semiconductor fins are level with top surfaces of the isolation regions as a result of performing the step of applying the planarization process and removing a defect semiconductor fin to form a vacant trench.

In accordance with an embodiment, an apparatus comprises a first semiconductor fin, a second semiconductor fin and a third semiconductor fin over a substrate, wherein the first semiconductor fin and the second semiconductor are separated by a first isolation region and the second semiconductor fin and the third semiconductor are separated by a second isolation region, and wherein a width of the first isolation region is greater than a width of the second isolation region.

In accordance with an embodiment, a method comprises forming a plurality of isolation regions including a first isolation region, a second isolation region and a third isolation region in a substrate, removing upper portions the substrate to form a plurality of trenches including a first trench and a second trench, wherein the first trench is between the first isolation region and the second isolation region and the second trench is between the second isolation region and the third isolation region.

The method further comprises growing a plurality of semiconductor fins including a first semiconductor fin in the first trench and a second semiconductor fin in the second trench through an epitaxial growth process, removing a defect semiconductor fin to form a vacant trench, inspecting top surfaces of the plurality of semiconductor fins to find the vacant trench and growing a new semiconductor fin in the vacant trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate formed of a first semiconductor material, wherein the substrate comprises a plurality of isolation regions;
   etching away upper portions of the substrate to form a plurality of trenches, wherein each trench is between two adjacent isolation regions;
   over-growing a plurality of semiconductor fins in the trenches over the substrate through an epitaxial growth process, wherein upper portions of the semiconductor fins are above top surfaces of the isolation regions;
   applying a planarization process to the semiconductor fins, wherein top surfaces of the semiconductor fins are level with top surfaces of the isolation regions as a result of performing the step of applying the planarization process; and
   removing a defect semiconductor fin to form a vacant trench.

2. The method of claim 1, further comprising:
   growing a new semiconductor fin in the vacant trench.

3. The method of claim 1, wherein:
   the isolation regions are shallow trench isolation regions and formed of a first dielectric material.

4. The method of claim 3, further comprising:
   depositing the first dielectric material in the vacant trench.

5. The method of claim 3, further comprising:
   depositing a second dielectric material in the vacant trench, wherein the second dielectric material is different from the first dielectric material.

6. The method of claim 5, wherein:
   the first dielectric material is oxide; and
   the second dielectric material is nitride.

7. The method of claim 1, further comprising:
   removing the defect semiconductor fin through a selective etching process.

8. The method of claim 7, further comprising:
   applying the selective etching process to the defect semiconductor fin until a top surface of the substrate is exposed.

9. The method of claim 1, wherein:
   the planarization process is a chemical mechanical polish (CMP) process.

10. A method comprising:
    forming a plurality of isolation regions including a first isolation region, a second isolation region and a third isolation region in a substrate;
    removing upper portions the substrate to form a plurality of trenches including a first trench and a second trench, wherein:
       the first trench is between the first isolation region and the second isolation region; and
       the second trench is between the second isolation region and the third isolation region;
    growing a plurality of semiconductor fins including a first semiconductor fin in the first trench and a second semiconductor fin in the second trench through an epitaxial growth process;
    removing a defect semiconductor fin to form a vacant trench;
    inspecting top surfaces of the plurality of semiconductor fins to find the vacant trench; and
    growing a new semiconductor fin in the vacant trench.

11. The method of claim 10, further comprising:
    over-growing the first semiconductor fin and the second semiconductor fin through the epitaxial growth process, wherein upper portions of the first semiconductor fin and the second semiconductor fin are above top surfaces of the plurality of isolation regions.

12. The method of claim 11, further comprising:
applying a chemical mechanical polish (CMP) process to the upper portions of the first semiconductor fin and the second semiconductor fin, wherein top surfaces of the first semiconductor fin and the second semiconductor fin are level with top surfaces of the plurality of isolation regions as a result of performing the step of applying the CMP process.

13. The method of claim 10, wherein:
the first isolation region, the second isolation region and the third isolation region are formed of oxide.

14. The method of claim 10, further comprising:
removing the defect semiconductor fin through a selective etching process.

15. A method comprising:
forming a plurality of trenches including a first trench and a second trench in a substrate, wherein:
    the first trench is between a first isolation region and a second isolation region; and
    the second trench is between the second isolation region and a third isolation region;
epitaxially growing a plurality of semiconductor fins in the plurality of trenches;
removing a defect semiconductor fin to form a vacant trench; and
filling the vacant trench with a material.

16. The method of claim 15, further comprising:
after filling the vacant trench, forming an isolation region comprising a first oxide region, a nitride region and a second oxide region, wherein the nitride region is between the first oxide region and the second oxide region.

17. The method of claim 15, wherein:
the isolation regions are formed of oxide; and
the material is nitride.

18. The method of claim 15, wherein:
the isolation regions are formed of oxide; and
the material is oxide.

19. The method of claim 15, wherein:
the isolation regions are formed of oxide; and
the material is a semiconductor material.

20. The method of claim 15, wherein:
after the step of epitaxially growing the plurality of semiconductor fins in the first trench and the second trench, upper portions of the plurality of semiconductor fins are above top surfaces of the isolation regions.

* * * * *